United States Patent
Lin (10) Patent No.: US 10,734,973 B2
(45) Date of Patent: *Aug. 4, 2020

(54) SWITCHED CAPACITOR CIRCUIT AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/795,660

(22) Filed: Feb. 20, 2020

(65) Prior Publication Data

US 2020/0195234 A1 Jun. 18, 2020

Related U.S. Application Data

(60) Continuation of application No. 16/716,678, filed on Dec. 17, 2019, which is a division of application No. (Continued)

(51) Int. Cl.
*H03K 17/687* (2006.01)
*H03K 3/01* (2006.01)

(52) U.S. Cl.
CPC ............ *H03K 3/01* (2013.01); *H03K 17/687* (2013.01)

(58) Field of Classification Search
CPC ...... H03K 3/01; H03K 17/687; H03B 5/1265; H03H 19/004
See application file for complete search history.

(56) References Cited

U.S. PATENT DOCUMENTS 7,002,393 B2 2/2006 Yeh
9,190,985 B2 11/2015 Jou et al.
(Continued)

FOREIGN PATENT DOCUMENTS

TW 200533058 A 10/2005
TW 201742516 A 12/2017
WO 2018065066 A1 4/2018

OTHER PUBLICATIONS

Taiwan Office Action and search report dated Jun. 3, 2020 in Taiwan application (No. 108135361).

*Primary Examiner* — Jung Kim
(74) *Attorney, Agent, or Firm* — McClure, Qualey & Rodack, LLP (57) ABSTRACT

A circuit and method are provided. The method couples a first bias signal to a first internal node and a second internal node via a first resistor and a second resistor, respectively, couples a second bias signal to a third internal node and a fourth internal node via a third resistor and a fourth resistor, respectively. The method further couples the first internal node to the second internal node via a switch of a first type controlled by a first control signal, couples the third internal node to the fourth internal node via a switch of a second type controlled by a second control signal, wherein the second control signal is an inversion of the first control signal, couples a first terminal to the first internal node and the third internal node via a first capacitor and a third capacitor, respectively; and couples a second terminal to the second internal node and the fourth internal node via a second capacitor and a fourth capacitor, respectively.

7 Claims, 6 Drawing Sheets

Related U.S. Application Data

16/195,926, filed on Nov. 20, 2018, now Pat. No. 10,560,074.

(56) References Cited

U.S. PATENT DOCUMENTS

| | | |
|---|---|---|
| 9,270,273 B2 * | 2/2016 | Mukhopadhyay .......................... H03K 19/018507 |
| 9,337,806 B2 | 5/2016 | Jou et al. |
| 10,229,816 B2 | 3/2019 | Coummou et al. |

* cited by examiner

SWITCHED CAPACITOR CIRCUIT AND METHOD THEREOF

CROSS-REFERENCE TO RELATED APPLICATION

The present application is a continuation of U.S. application Ser. No. 16/716,678, filed Dec. 17, 2019, which is a division of U.S. application Ser. No. 16/195,926, filed Nov. 20, 2018, now U.S. Pat. No. 10,560,074.

BACKGROUND OF THE INVENTION

Field of the Invention

The present invention generally relates to switched capacitor circuit, and more particularly to a switched capacitor circuit having high linearity in multiple operating states.

Description of Related Art

Figure 1A:
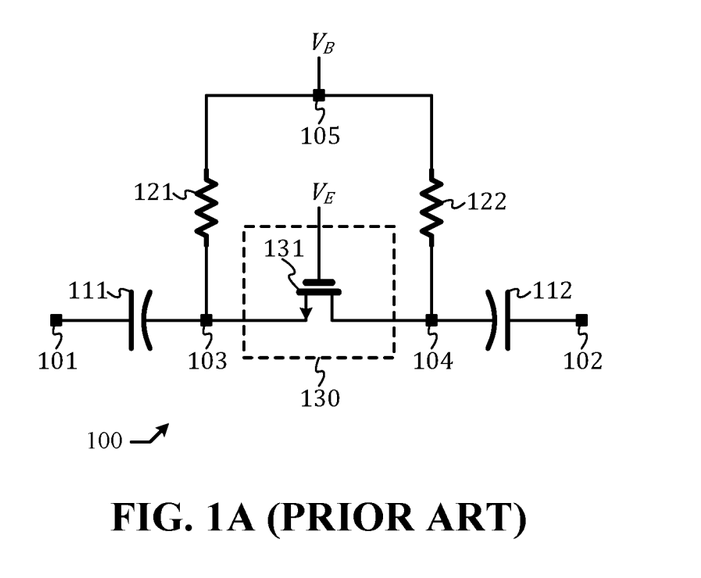
FIG. 1A shows a schematic diagram of a prior art switched capacitor.

As is known, a switched capacitor is typically configured to have a first capacitance when it is in a first state, and a second capacitance when it is in a second state. As depicted in FIG. 1A, a prior art switched capacitor 100 comprises: a first capacitor 111 configured to provide AC (alternate coupling) coupling between node 101 and node 103; a second capacitor 112 configured to provide AC coupling between node 102 and node 104; a switch 130 configured to provide DC (direct current) coupling between node 103 and node 104 in accordance with an enabling signal $V_E$, the switch 130 being embodied by a NMOS (n-channel metal oxide semiconductor) transistor 131; a first resistor 121 configured to provide DC coupling between node 103 and node 105; and a second resistor 122 configured to provide DC coupling between node 104 and node 105, wherein node 105 is driven by a bias signal $V_B$.

Figure 1B:
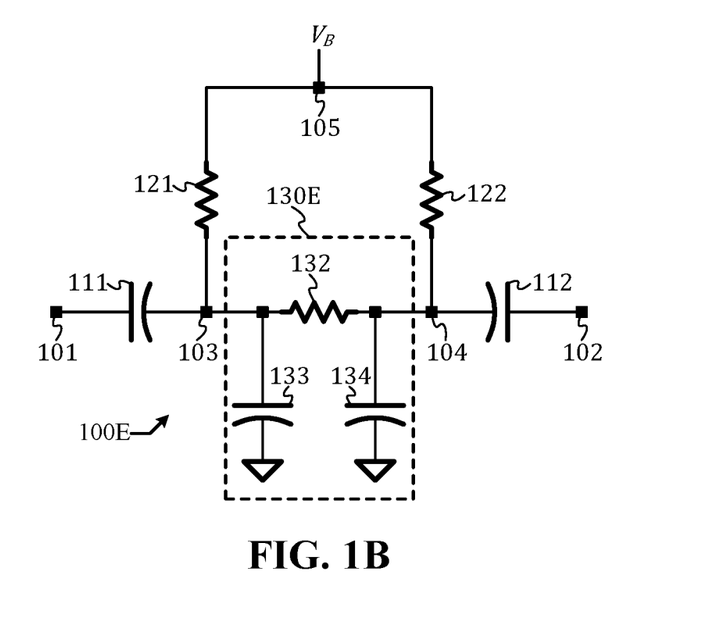
FIG. 1B shows a schematic diagram of an equivalent circuit of the switched capacitor of FIG. 1A.

A schematic diagram of an equivalent circuit 100E of switch capacitor 100 is depicted in FIG. 1B. The equivalent circuit 100E is the same as switched capacitor 100 of FIG. 1A except that the switch 130 in FIG. 1A is replaced by an equivalent □-network 130E comprising a first parasitic capacitor 133 that shunts node 103 to ground, an equivalent resistor 132 placed across node 103 and node 104, and a second parasitic capacitor 134 that shunts node 104 to ground, wherein: a value of the equivalent resistor 132 is determined by $V_E$-$V_B$. Switched capacitor 100 has a first state and a second state. In the first state, $V_E$-$V_B$ is sufficiently higher than a threshold voltage of the NMOS transistor 131, so that the switch 130 is effectively turned on, leading to a low resistance (of the equivalent resistor 132). In the second state, $V_E$-$V_B$ is sufficiently lower than the threshold voltage of the NMOS transistor 131, so that the switch 130 is effectively turned off, leading to a high resistance (of the equivalent resistor 132). Preferably, in the first (second) state, the resistance of the equivalent resistor 132 is so small (large) that the switch 130 is substantially equivalent to a short (open) circuit. Provided the two DC coupling resistors 121 and 122 have resistance substantially larger than impedance of capacitors 111, 112, 133, and 134 at a frequency of interest, in the first state the switched capacitor 100 is substantially equivalent to a serial connection of capacitors 111 and 112, while in the second state the switched capacitor 100 is substantially equivalent to a serial connection of capacitors 111, 133, 134, and 112. It is clear to those of ordinary skills in the art that the serial connection of capacitors 111 and 112 provides a higher capacitance than the serial connection of capacitors 111, 133, 134, and 112.

One issue with the prior art switched capacitor 100 is: the two parasitic capacitors 133 and 134 are due to junction capacitance between source/drain and substrate of NMOS transistor 131 and depend on voltages at node 103 and node 104 and are nonlinear. As a result, the equivalent capacitance of the switched capacitor 100 in the second state is nonlinear. In many applications, the nonlinearity is undesirable.

What is desired is a switched capacitor that can be highly linear in both states.

BRIEF SUMMARY OF THIS INVENTION

In an embodiment, a circuit comprises: a first capacitor configured to provide AC coupling between a terminal and a first internal node; a second capacitor configured to provide AC coupling between the terminal and a second internal node; a N-type switch comprising a NMOS (n-channel metal oxide semiconductor) transistor configured to provide DC coupling between the first internal node and a ground node in accordance with a first control signal; a P-type switch comprising a PMOS (p-channel metal oxide semiconductor) transistor configured to provide DC coupling between the second internal node and a power supply node in accordance with a second control signal that is an inversion of the first control signal; a transmission gate configured to provide DC coupling between the first internal node and the second internal node in accordance with a third control signal and a fourth control signal that is an inversion of the third control signal; a first resistor configured to provide DC coupling between a first bias node and the first internal node; and a second resistor configured to provide DC coupling between a second bias node and the second internal node.

In an embodiment, a method comprises: coupling a first bias signal to a first internal node via a first resistor; coupling a second bias signal to a second internal node via a second resistor; coupling the first internal node to a ground node via a N-type switch controlled by a first control signal; coupling the second internal node to a power supply node via a P-type switch controlled by a second control signal, wherein the second control signal is an inversion of the first control signal; coupling the first internal node to the second internal node via a transmission gate controlled by a third control signal and a fourth control signal, wherein the fourth control signal is an inversion of the third control signal; coupling a terminal to the first internal node via a first capacitor; and coupling the terminal to the second internal node via a second capacitor.

DETAILED DESCRIPTION OF THIS INVENTION

The present invention relates to switched capacitor. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "(circuit) node," "ground (node)," "signal," "voltage," "bias," "AC (alternate current) coupling," "DC (direct current) coupling," "capacitor," "capacitance," "resistor," "resistance," "transmission gate," "CMOS (complementary metal oxide semiconductor)," "PMOS (P-channel metal oxide semiconductor) transistor," "NMOS (N-channel metal oxide semiconductor) transistor," "frequency," "series," "shunt," "switch," "transmission gate," and "impedance." Terms and basic concepts like these are apparent to those of ordinary skill in the art and thus will not be explained in detail here. Those of ordinary skill in the art can also recognize symbols of PMOS transistor and NMOS transistor, and identify the "source," the "gate," and the "drain" terminals thereof.

A logical signal is a signal of two states: a first logical state (or a "high" state), and a second logical state (or a "low" state). When a logical signal is said to be high (low), it means it is in the "high" ("low") state, and it occurs when the logical signal is sufficiently above (below) a threshold level that is called a "trip point." Every logical signal has a trip point, and two logical signals may not necessarily have the same trip point.

A switch is a circuit having two states controlled in accordance with a control signal that is a logical signal. When the control signal is in a first logical state, the switch is in a first state and has a low resistance. When the control signal is in a second logical state, the switch is in a second state and has a high resistance.

Figure 2A:
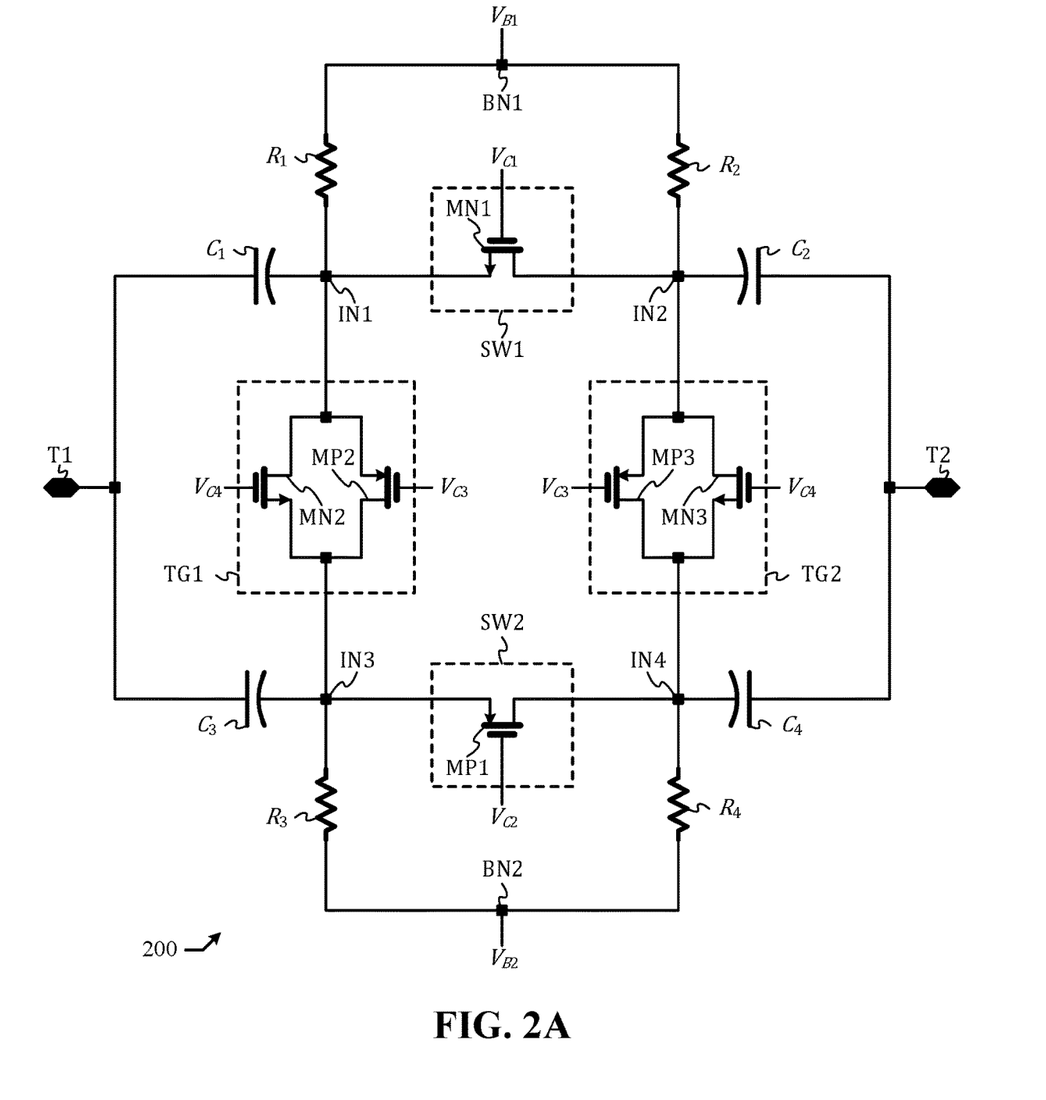
FIG. 2A shows a schematic diagram of a switched capacitor in accordance with an embodiment of the present disclosure.

As depicted in FIG. 2A, a switched capacitor circuit 200 in accordance with an embodiment of the present disclosure comprises: a first capacitor $C_1$ configured to provide AC (alternate current) coupling between a first terminal T1 and a first internal node IN1; a second capacitor $C_2$ configured to provide AC coupling between a second terminal T2 and a second internal node IN2; a third capacitor $C_3$ configured to provide AC coupling between the first terminal T1 and a third internal node IN3; a fourth capacitor $C_4$ configured to provide AC coupling between the second terminal T2 and a fourth internal node IN4; a N-type switch SW1 configured to provide DC (direct current) coupling between the first internal node IN1 and the second internal node IN2 in accordance with a first control signal $V_{C1}$; a P-type switch SW2 configured to provide DC coupling between the third internal node IN3 and the fourth internal node IN4 in accordance with a second control signal $V_{C2}$; a first transmission gate TG1 configured to provide DC coupling between the first internal node IN1 and the third internal node IN3 in accordance with a third control signal $V_{C3}$ and a fourth control signal $V_{C4}$; a second transmission gate TG2 configured to provide DC coupling between the second internal node IN2 and the fourth internal node IN4 in accordance with the third control signal $V_{C3}$ and the fourth control signal $V_{C4}$; a first resistor $R_1$ configured to provide DC coupling between the first internal node IN1 and a first bias node BN1; a second resistor $R_2$ configured to provide DC coupling between the second internal node IN2 and the first bias node BN1; a third resistor $R_3$ configured to provide DC coupling between the third internal node IN3 and a second bias node BN2; and a fourth resistor $R_4$ configured to provide DC coupling between the fourth internal node IN4 and the second bias node BN2. A first bias signal $V_{B1}$ drives the first bias node BN1, while a second bias signal $V_{B2}$ drives the second bias node BN2. The first control signal $V_{C1}$ and the second control signal $V_{C2}$ are logical signals and complementary to one another. That is, when $V_{C1}$ is in a logical high state, $V_{C2}$ will be in a logical low state, and vice versa. The third control signal $V_{C3}$ and the fourth control signal $V_{C4}$ are logical signal and complementary to one another. The first control signal $V_{C1}$ and the third control signal $V_{C3}$ always have the same logical state, but not necessarily the same voltage. Likewise, the second control signal $V_{C2}$ and the fourth control signal $V_{C4}$ always have the same logical state, but not necessarily the same voltage.

The first bias signal $V_{B1}$ is used to establish a DC voltage at the first internal node IN1 and the second internal node IN2 via the first resistor R1 and the second resistor R2, respectively. The second bias signal $V_{B2}$ is used to establish a DC voltage at the third internal node IN3 and the fourth internal node IN4 via the third resistor R3 and the fourth resistor R4, respectively.

The N-type switch SW1, embodied by a first NMOS (n-channel metal oxide semiconductor) transistor MN1, is turned on when the voltage $V_{C1}$-$V_{B1}$ is sufficiently high, and turned off otherwise. The P-type switch SW2, embodied by a first PMOS (p-channel metal oxide semiconductor) transistor MP1, is turned on when the voltage $V_{C2}$-$V_{B2}$ is sufficiently low, and turned off otherwise. The first transmission gate TG1, embodied by a parallel connection of a second NMOS transistor MN2 that is controlled by $V_{C4}$ and a second PMOS transistor MP2 that is controlled by $V_{C3}$, is turned on when $V_{C3}$ is sufficiently low or $V_{C4}$ is sufficiently high and turned off otherwise. The second transmission gate TG2, embodied by a parallel connection of a third NMOS transistor MN3 that is controlled by $V_{C4}$ and a third PMOS transistor MP3 that is controlled by $V_{C3}$, is turned on when $V_{C3}$ is sufficiently low or $V_{C4}$ is sufficiently high and turned off otherwise.

The switched capacitor 200 has two states: a first state wherein $V_{C1}$ and $V_{C3}$ are high and $V_{C2}$ and $V_{C4}$ are low, and a second state wherein $V_{C1}$ and $V_{C3}$ are low and $V_{C2}$ and $V_{C4}$ are high. Here, "high" and "low" are pertaining to logical states. In the first state, SW1 and SW2 are turned on, while TG1 and TG2 are turned off. In the second state, SW1 and SW2 are turned off, while TG1 and TG2 are turned off.

By way of example but not limitation: a frequency of interest is 5 GHz; the switched capacitor 200 is fabricated using a 28 nm CMOS process with 1.1V supply; the threshold voltage is approximately 450 mV for all NMOS transistors (i.e. MN1, MN2, and MN3); the threshold voltage is approximately −450 mV for all PMOS transistors (i.e. MP1, MP2, and MP3); the four capacitors $C_1$, $C_2$, $C_3$, and $C_4$ are all 360 fF; the four resistors $R_1$, $R_2$, $R_3$, and $R_4$ are all 10 KOhm; the W/L (which stands for width/length) of NMOS transistor MN1 is 400 □m/30 nm; the W/L of PMOS transistor MP1 is 400 □m/30 nm; the W/L of NMOS transistor MN2 is 20 □m/30 nm; the W/L of NMOS transistor MN3 is 20 □m/30 nm; the W/L of PMOS transistor MP2 is 20 ☐m/30 nm; and the W/L of PMOS transistor MP3 is 20 ☐m/30 nm; and values of $V_{C1}$, $V_{C2}$, $V_{C3}$, $V_{C4}$, $V_{B1}$, and $V_{B2}$ in the two states are tabulated in the table below:

| state  | $V_{C1}$ | $V_{C2}$ | $V_{C3}$ | $V_{C4}$ | $V_{B1}$ | $V_{B2}$ |
|--------|----------|----------|----------|----------|----------|----------|
| First  | 1.1 V    | 0 V      | 1.1 V    | 0 V      | 0 V      | 1.1 V    |
| Second | 0 V      | 1.1 V    | 0 V      | 1.1 V    | 0.55 V   | 0.55 V   |

Accordingly, in the first state wherein $V_{C1}$ and $V_{C3}$ are high (1.1V) and $V_{C2}$ and $V_{C4}$ are low (0V), SW1 and SW2 are turned on, while TG1 and TG2 are turned off; in the second state wherein $V_{C1}$ and $V_{C3}$ are low (0V) and $V_{C2}$ and $V_{C4}$ are high (1.1V), SW1 and SW2 are turned off, while TG1 and TG2 are turned on.

Figure 2B:
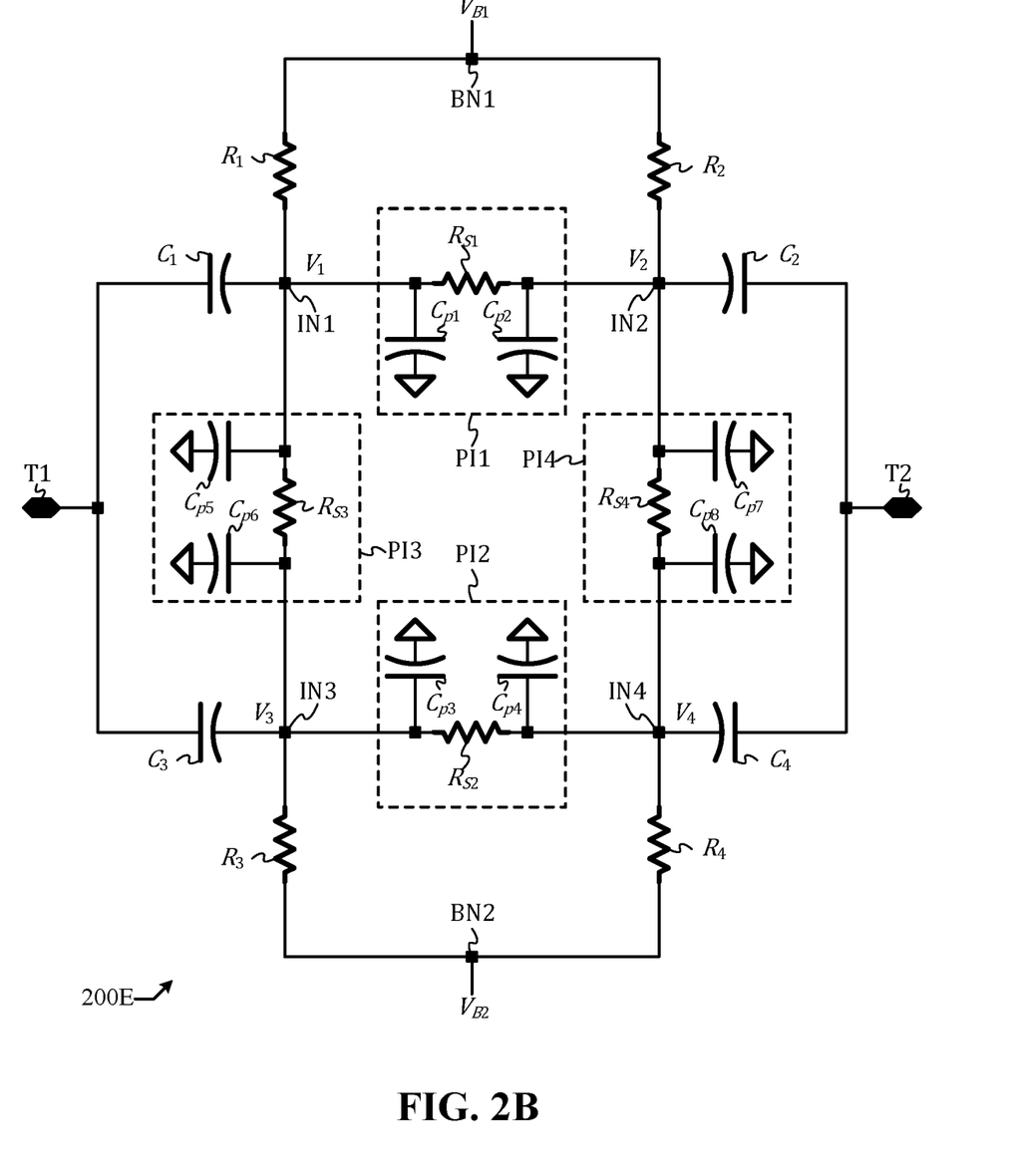
FIG. 2B shows a schematic diagram of an equivalent circuit of the switched capacitor of FIG. 2A.

An equivalent circuit 200E of switched capacitor 200 is depicted in FIG. 2B. The equivalent circuit 200E is the same as switched capacitor 200 except: the first switch SW1, the second switch SW2, the first transmission gate TG1, and the second transmission gate TG2 are replaced by a first ☐-network PI1, a second ☐-network PI2, a third ☐-network PI3, and a fourth ☐-network PI4, respectively. The first ☐-network PI1 comprises a first shunt capacitor $C_{p1}$, a first serial resistor $R_{S1}$, and a second shunt capacitor $C_{p2}$. The second ☐-network PI2 comprises a third shunt capacitor $C_{p3}$, a second serial resistor $R_{S2}$, and a fourth shunt capacitor $C_{p4}$. The third ☐-network PI3 comprises a fifth shunt capacitor $C_{p5}$, a third serial resistor $R_{S3}$, and a sixth shunt capacitor $C_{p6}$. The fourth ☐-network PI4 comprises a seventh shunt capacitor $C_{p7}$, a fourth serial resistor $R_{S4}$, and an eighth shunt capacitor $C_{p8}$. $R_{S1}$ ($R_{S2}$) models the source-drain resistance of NMOS (PMOS) transistor MN1 (MP1). $C_{p1}$ ($C_{p3}$) and $C_{p2}$ ($C_{p4}$) model parasitic capacitance of NMOS (PMOS) transistor MN1 (MP1) at two ends, i.e. source and drain. $R_{S3}$ ($R_{S4}$) models a parallel combination of the source-drain resistance of NMOS transistor MN2 (MN3) and the source-drain resistance of PMOS transistor MP2 (MP3). $C_{p5}$ ($C_{p7}$) and $C_{p6}$ ($C_{p8}$) model total parasitic capacitance of NMOS transistor MN2 (MN2) and PMOS transistor MP2 (MP3) at two ends, i.e. source and drain.

In the first state, $R_{S1}$ and $R_{S2}$ are small and can be deemed short circuits (due to having much smaller impedance, compared to devices that they couple to respectively). In the meanwhile, $R_{S3}$ and $R_{S4}$ are very large and can be deemed open circuits (due to having much larger impedance, compared to devices that they couple to respectively). Therefore, $V_1$ and $V_2$, which denote the voltages at the first internal node IN1 and at the second internal node IN2, respectively, are approximately equal. Likewise, $V_3$ and $V_4$, which denote the voltages at the third internal node IN3 and at the fourth internal node IN4, respectively, are approximately equal. In a differential signaling application, wherein the signal at the first terminal T1 and the signal at the second terminal T2 are complementary and every voltage change at the first terminal T1 is accompanied by an opposite voltage change at the second terminal T2, all the four internal nodes IN1, IN2, IN3, and IN4 are substantially stationary, and all the parasitic capacitances ($C_{p1}$, $C_{p2}$, $C_{p3}$, $C_{p4}$, $C_{p5}$, $C_{p6}$, $C_{p7}$, $C_{p8}$) become irrelevant. Therefore, an effective capacitance $C_{eff1}$ between the two terminals T1 are T2 is expressed as:

$$C_{eff1} \approx \frac{1}{\frac{1}{C_1} + \frac{1}{C_2}} + \frac{1}{\frac{1}{C_3} + \frac{1}{C_4}} \quad (1)$$

In the second state, $R_{S3}$ and $R_{S4}$ are very small and can be deemed short circuits. In the meanwhile, $R_{S1}$ and $R_{S2}$ are very large and can be deemed open circuits. Therefore, $V_1$ and $V_3$ are approximately equal. Likewise, $V_2$ and $V_4$ are approximately equal. In a differential signal application, an effective capacitance $C_{eff2}$ between the two terminals T1 are T2 is expressed as:

$$C_{eff2} \approx \frac{1}{\frac{1}{C_1 + C_3} + \frac{1}{C_{p1} + C_{p3} + C_{p5} + C_{p6}} + \frac{1}{C_{p2} + C_{p4} + C_{p7} + C_{p8}} + \frac{1}{C_2 + C_4}} \quad (2)$$

Let us examine various terms in equation (2). $C_{p1}$ is a nonlinear junction capacitance of NMOS transistor MN1, and $C_{p3}$ is a nonlinear junction capacitance of PMOS transistor MP1; both are nonlinear but of complementary nonlinearity due to complementary nature of devices. Therefore, their nonlinearities can offset one another and $C_{p1}+C_{p3}$ thus can be highly linear, provided NMOS transistor MN1 and PMOS transistor MP1 are of the same sizes. By the same token, $C_{p2}+C_{p4}$ can be highly linear. On the other hand, $C_{p5}$ and $C_{p6}$ are junction capacitances of transmission gate TG1, which comprises NMOS transistor MN2 and PMOS transistor MP2, and can be highly linear, provided NMOS transistor MN2 and PMOS transistor MP2 are of the same sizes. Likewise, $C_{p7}$ and $C_{p8}$ can be highly linear. Therefore, the term $$\frac{1}{C_{p1} + C_{p3} + C_{p5} + C_{p6}}$$

can be highly linear, so is the term $$\frac{1}{C_{p2} + C_{p4} + C_{p7} + C_{p8}}.$$

As a result, $C_{eff2}$ can be highly linear. Switched capacitor 200, therefore, can be highly linear in both states, and overcome the issue of prior art switched capacitor 100.

Figure 2C:
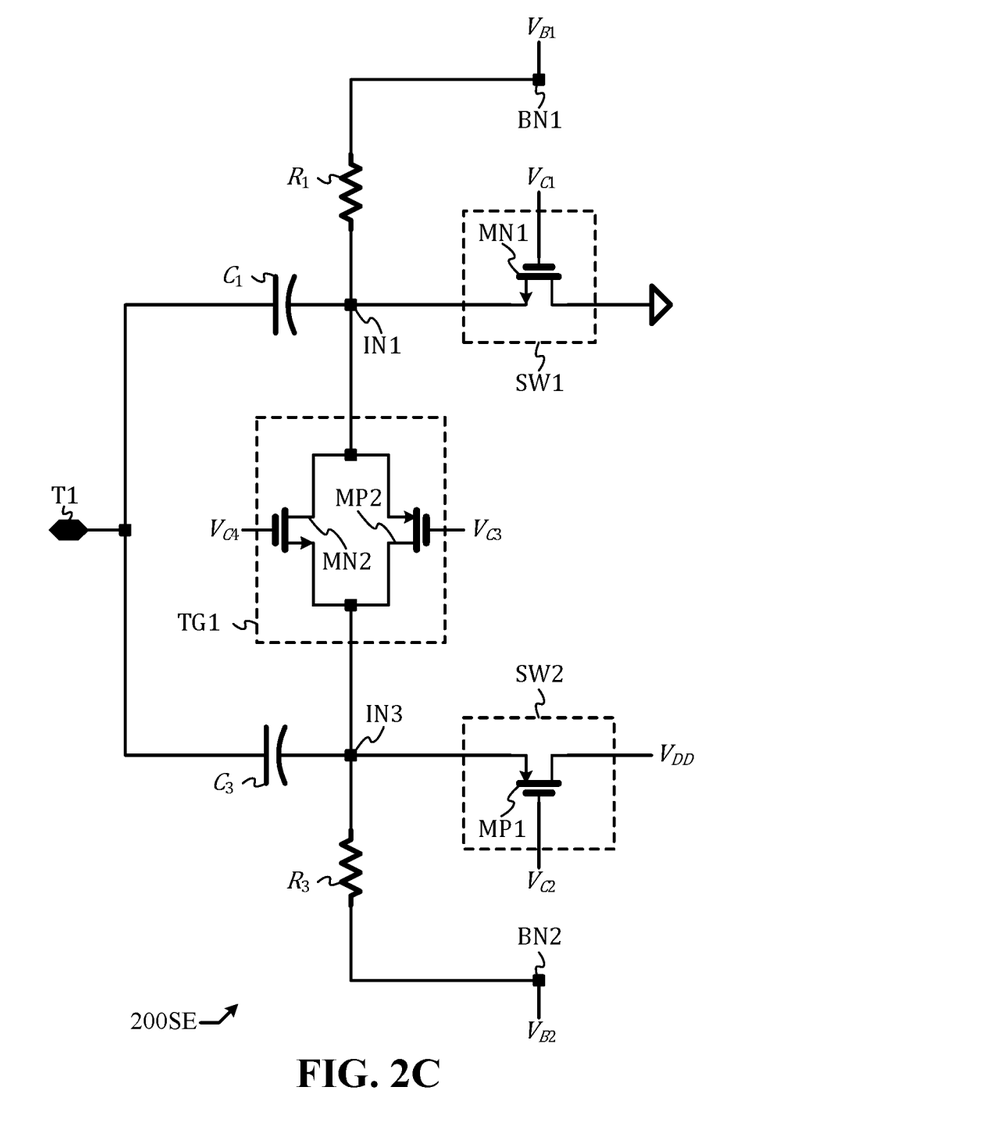
FIG. 2C shows a schematic diagram of a single-ended switched capacitor in accordance with an embodiment of the present invention.

Switched capacitor 200 is designed for differential signaling application but can be modified for single-ended signaling application. A schematic diagram of a single-ended switched capacitor 200SE is depicted in FIG. 2C. The single-ended switched capacitor 200SE is the same as the switched capacitor 200 except for the following changes: T2, TG2, $R_2$, $R_4$, $C_2$, and $C_4$ are removed, the second internal node IN2 is replaced by ground, and the fourth internal node IN4 is replaced by $V_{DD}$, which denotes a power supply node that is approximately 1.1V by way of example but not limitation. The equivalent capacitance in the first state becomes: $C_{eff1} \approx C_1 + C_2$; the equivalent capacitance in the second state becomes:

$$C_{eff2} \approx \frac{1}{\frac{1}{C_1+C_3} + \frac{1}{C_{p1}+C_{p3}+C_{p5}+C_{p6}}}.$$

Figure 3:
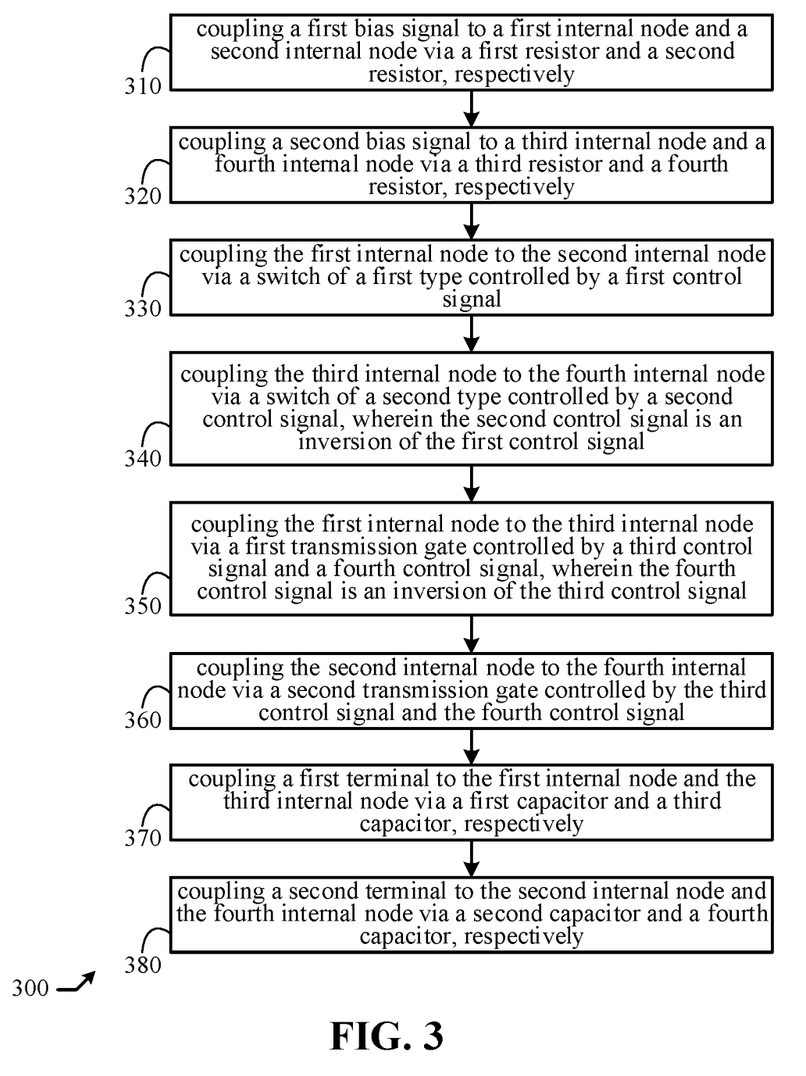
FIG. 3 shows a flow diagram of a method in accordance with an embodiment of the present disclosure.

As illustrated by a flow diagram 300 depicted in FIG. 3, a method in accordance with the present invention comprises the following steps: (step 310) coupling a first bias signal to a first internal node and a second internal node via a first resistor and a second resistor, respectively; (step 320) coupling a second bias signal to a third internal node and a fourth internal node via a third resistor and a fourth resistor, respectively; (step 330) coupling the first internal node to the second internal node via a switch of a first type controlled by a first control signal; (step 340) coupling the third internal node to the fourth internal node via a switch of a second type controlled by a second control signal, wherein the second control signal is an inversion of the first control signal; (step 350) coupling the first internal node to the third internal node via a first transmission gate controlled by a third control signal and a fourth control signal, wherein the fourth control signal is an inversion of the third control signal; (step 360) coupling the second internal node to the fourth internal node via a second transmission gate controlled by the third control signal and the fourth control signal; (step 370) coupling a first terminal to the first internal node and the third internal node via a first capacitor and a third capacitor, respectively; and (step 380) coupling a second terminal to the second internal node and the fourth internal node via a second capacitor and a fourth capacitor, respectively.

Figure 4:
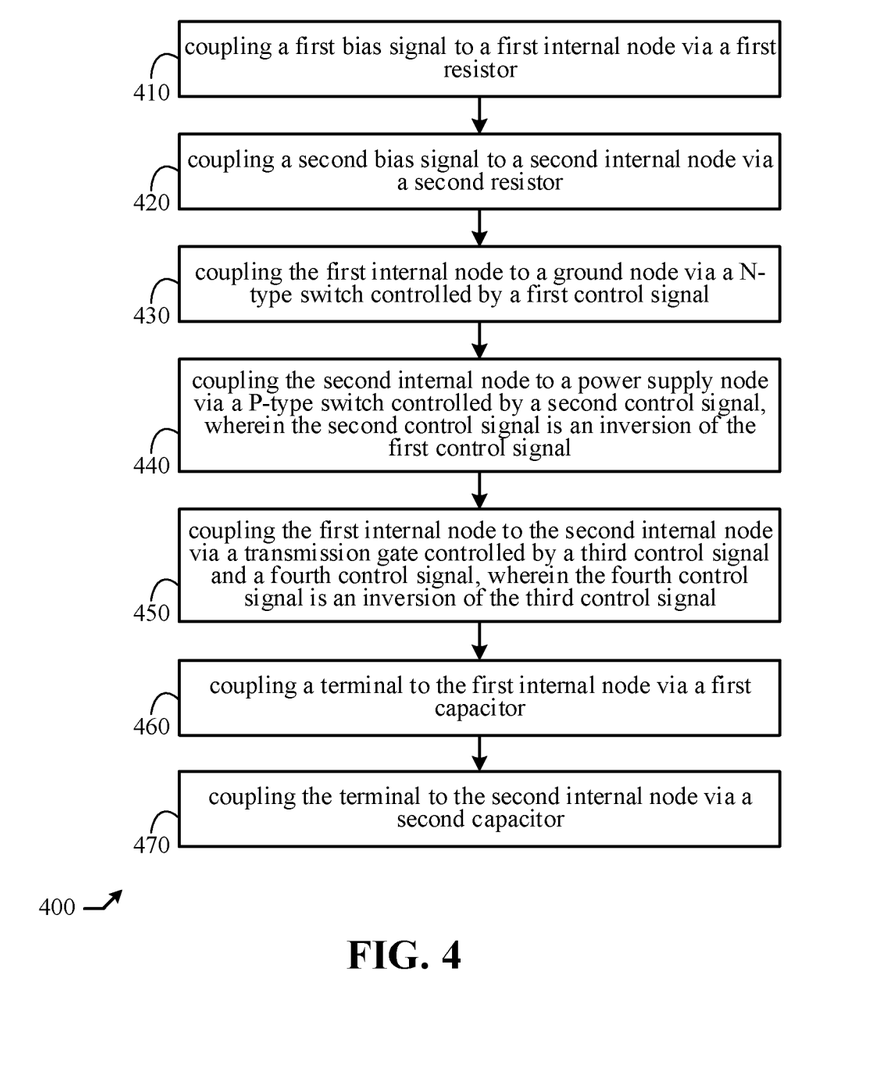
FIG. 4 shows a flow diagram of a method in accordance with an embodiment of the present disclosure.

Furthermore, as illustrated by a flow diagram 400 depicted in FIG. 4, a method in accordance with the present invention comprises the following steps: (step 410) coupling a first bias signal to a first internal node via a first resistor; (step 420) coupling a second bias signal to a second internal node via a second resistor; (step 430) coupling the first internal node to a ground node via a N-type switch controlled by a first control signal; (step 440) coupling the second internal node to a power supply node via a P-type switch controlled by a second control signal, wherein the second control signal is an inversion of the first control signal; (step 450) coupling the first internal node to the second internal node via a transmission gate controlled by a third control signal and a fourth control signal, wherein the fourth control signal is an inversion of the third control signal; (step 460) coupling a terminal to the first internal node via a first capacitor; and (step 470) coupling the terminal to the second internal node via a second capacitor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit comprising:
    a first capacitor configured to provide AC (alternate current) coupling between a first terminal and a first internal node;
    a second capacitor configured to provide AC coupling between a second terminal and a second internal node;
    a third capacitor configured to provide AC coupling between the first terminal and a third internal node;
    a fourth capacitor configured to provide AC coupling between the second terminal and a fourth internal node;
    a first resistor configured to provide DC (direct current) coupling between a first bias node and the first internal node;
    a second resistor configured to provide DC coupling between the first bias node and the second internal node;
    a third resistor configured to provide DC coupling between a second bias node and the third internal node;
    a fourth resistor configured to provide DC coupling between the second bias node and the fourth internal node;
    a switch of a first type configured to provide DC coupling between the first internal node and the second internal node in accordance with a first control signal; and
    a switch of a second type configured to provide DC coupling between the third internal node and the fourth internal node in accordance with a second control signal that is an inversion of the first control signal.

2. The circuit of claim 1, wherein the switch of the first type comprises a first NMOS (n-channel metal oxide semiconductor) transistor controlled by the first control signal, and the switch of the second type comprises a first PMOS transistor (p-channel metal oxide semiconductor) transistor controlled by the second control signal.

3. The circuit of claim 1, wherein: the first bias node and the second bias node are driven by a first bias signal and a second bias signal, respectively; the first bias signal and the first control signal are of opposite logical states; and the second bias signal and the second control signal are of opposite logical states.

4. A method comprising:
    coupling a first bias signal to a first internal node and a second internal node via a first resistor and a second resistor, respectively;
    coupling a second bias signal to a third internal node and a fourth internal node via a third resistor and a fourth resistor, respectively;
    coupling the first internal node to the second internal node via a switch of a first type controlled by a first control signal;
    coupling the third internal node to the fourth internal node via a switch of a second type controlled by a second control signal, wherein the second control signal is an inversion of the first control signal;
    coupling a first terminal to the first internal node and the third internal node via a first capacitor and a third capacitor, respectively; and
    coupling a second terminal to the second internal node and the fourth internal node via a second capacitor and a fourth capacitor, respectively.

5. The method of claim 4, wherein the switch of the first type comprises a first NMOS (n-channel metal oxide semiconductor) transistor controlled by the first control signal, and the switch of the second type comprises a first PMOS transistor (p-channel metal oxide semiconductor) transistor controlled by the second control signal.

6. The method of claim 4, wherein: the first bias signal and the first control signal are of opposite logical states; and the second bias signal and the second control signal are of opposite logical states.

7. The method of claim 6, wherein the first bias signal and the second bias signal are of the same voltage when the first control signal is in a logical low state.

* * * * *